United States Patent [19]
Kovner et al.

[11] Patent Number: 5,596,459
[45] Date of Patent: Jan. 21, 1997

[54] FULLY INTEGRATED PROGRAMMABLE FILTERS FOR DISC DRIVE SUBSYSTEMS

[75] Inventors: Vladimir Kovner; Vadim B. Minuhin, both of Oklahoma City; Srinivasan Surendran, Norman, all of Okla.

[73] Assignee: Seagate Technology, Inc., Scotts Valley, Calif.

[21] Appl. No.: 424,235

[22] Filed: Apr. 19, 1995

Related U.S. Application Data

[63] Continuation of Ser. No. 166,235, Dec. 10, 1993, abandoned, which is a continuation of Ser. No. 1,346, Jan. 7, 1993, abandoned.

[51] Int. Cl.⁶ .................................................. G11B 20/10
[52] U.S. Cl. .................................... 360/51; 360/67
[58] Field of Search .......................... 360/51, 39, 77.02, 360/78.04, 67, 65; 331/8, 132

[56] References Cited

U.S. PATENT DOCUMENTS 4,669,004  5/1987  Moon et al. .................. 360/77.08 X
5,369,376  11/1994  Leblebicioglu ...................... 331/8

FOREIGN PATENT DOCUMENTS 59-54017  5/1984  Japan ................................. 360/78.04

OTHER PUBLICATIONS

*Active Filter Design Using Operational Transconductance Amplifiers:* A Tutorial, by Randall L. Geiger and Edgar Sanchez–Sinencio, IEEE Circuits and Devices Magazine, Mar. 1985, pp. 20–32.

*Primary Examiner*—Aristotelis Psitos
*Assistant Examiner*—James T. Wilson
*Attorney, Agent, or Firm*—Kinney & Lange

[57] ABSTRACT

A disc drive system includes a plurality of subsystems. At least one of the subsystems includes a filter which is completely integrated using a synthetic integrated circuit element.

21 Claims, 8 Drawing Sheets

BLOCK DIAGRAM OF PLL

FULLY INTEGRATED PROGRAMMABLE FILTERS FOR DISC DRIVE SUBSYSTEMS

This is a file wrapper continuation of application Ser. No. 08/166,235, filed Dec. 10, 1993, now abandoned, which is a continuation of application Ser. No. 08/001,346, filed Jan. 7, 1993, now abandoned. U.S. Pat. No. 5,382,171 is also a division of application Ser. No. 08/001,346, filed Jan. 10, 1993.

BACKGROUND OF THE INVENTION

The present invention relates to the operation of subsystems of a disc drive. More particularly, the present invention relates to a programmable integrated filter for disc drive subsystems.

A magnetic disc, commonly used in a computer disc drive, is a flat circular platter with a magnetic surface on which data can be stored by selective polarization of portions of the magnetic surface. The presence or absence of polarity transitions between the polarized portions represents particular binary values. Typically, the magnetically polarized portions are arranged in a plurality of radially concentric tracks on the surface of the disc to aid in location and read back of the data.

As a magnetic transducer moves relative to the magnetic disc, it generates an electrical pulse each time it encounters a polarity transition on the disc. These electrical pulses create a read signal. The data within the read signal is read back, or recovered, by sending the signal through various subsystems of the disc drive. These subsystems typically include amplifiers, filters, and logic circuits.

For example, the incoming read signal often has varying peak-to-peak amplitude due to temperature variation, variations in the media surface, different characteristics of different magnetic transducers, and variations in the flying height of the magnetic transducers. In order to keep the amplitude within a desirable range, the read signal is provided to a feedback loop referred to as an automatic gain control (AGC) subsystem. The read signal is first fed to a variable-gain amplifier (VGA) whose gain is controlled by an electrical input. The read signal amplitude is then typically sampled by an "envelope detector", compared to a preassigned set point, and the difference (which represents an error signal) is fed back to the VGA. In this way, the output signal from the AGC subsystem can be regulated to maintain the amplitude of the read signal at a fixed level or within a desired range.

In accomplishing automatic gain control, the AGC subsystem typically includes (in addition to the VGA) a full waive rectifier and a low-pass, first order, R-C passive filter with a large discrete capacitor. Typically, the capacitor for the low-pass filter is so large that it must be a discrete component. The large size of the capacitor creates at least two problems. The first is that the discrete capacitor prohibits fully integrating the AGC subsystem. The second is that the fixed nature of the discrete capacitor restricts the efficient operation of the AGC subsystem to a single speed of operation.

After the read signal exits the AGC subsystem it is sent to a pulse detector subsystem in order to synchronize logic level transitions with the peaks of the read signal. Ideally, each electrical pulse in the read signal corresponds to a data bit on the disc. However, additional electrical pulses can be erroneously created between the data bits. These additional pulses can be caused by a number of events including: noise in the read back circuit, noise in the write circuit when data is written to the disc and spurious polarity transitions on the disc. In order for the data in the read signal to be useful, these additional, erroneous pulses must be eliminated from the read signal.

One way to eliminate additional pulses is to generate a series of read windows which represent time frames in which data pulses are expected. Pulses in the read signal which occur outside of these read windows are then filtered out of the read signal. In current disc drive systems, this technique is accomplished using a phase locked loop subsystem and a data separator. The phase locked loop generates the read windows and the data separator filters out the additional pulses. The phase locked loop generates the read windows by producing a clock signal with a frequency based on the frequency of pulses contained in the read signal.

The phase locked loop is capable of automatic adjustment, and it continually attempts to acquire a new frequency if the frequency of the pulses in the read signal changes. How quickly the phase locked loop adjusts to new frequencies affects the data quality and the data retrieval speed of the disc drive.

The data quality is determined by how much noise is present in the read signal as it leaves the data separator. While the disc drive is reading the data, it is said to be in the read mode. If the phase locked loop, while in the read mode, adjusts too quickly to changes in frequency, the data separator can interpret noise as data pulses. For instance, if there are four data pulses per second, a series of eight data pulses with a noise pulse between the seventh and eighth pulse will be interpreted as six pulses at a frequency of four pulses per second followed by three pulses at a frequency of six pulses per second. Therefore, when the disc drive is in the read mode, it is advantageous to have the phase locked loop not react too quickly to changes in frequency.

The data retrieval speed is affected by how quickly the phase locked loop can lock on to a clock frequency for a read signal from a different track when the transducer switches between tracks which have data recorded at different frequencies. While the disc drive is attempting to recover the clock signal, it is said to be in fast acquisition mode. If the phase locked loop, while in fast acquisition mode, adjusts too slowly to changes in frequency, the disc drive retrieval time increases. Therefore, it is advantageous to have the phase locked loop react quickly to changes in frequency when the disc drive is operating in fast acquisition mode.

Within the phase locked loop subsystem, the loop filter determines how quickly the phase locked loop adjusts itself based on changes of frequency in the read signal. The reaction time of the phase locked loop is controlled by a capacitor within the loop filter. By changing the capacitor, the loop filter reaction time can be changed. Increasing the size of the capacitor slows the reaction time of the loop filter while decreasing the size of the capacitor speeds up the reaction time of the loop filter.

Typically, the capacitor for the loop filter is so large that it must be a discrete component. The large size of the capacitor causes the same two problems as the discrete capacitor in the AGC subsystem. That is, the discrete capacitor prohibits fully integrating the phase locked loop, and the fixed nature of the discrete capacitor restricts the loop filter to operating efficiently in only one mode, either the read mode or the fast acquisition mode.

The inability to fully integrate the AGC subsystem and the phase locked loop has many negative effects. Discrete components take more board space and thus cause the disc drive to be larger. In addition, since the rest of the AGC subsystem and the phase locked loop is integrated, the discrete components require a second manufacturing step. This second manufacturing step increases drive costs and reduces quality.

The fixed nature of the capacitors also have negative effects. In order to achieve maximum efficiency in the phase locked loop and AGC subsystem, two filters must be built. Depending on the mode of operation, the appropriate filter must be switched into the phase locked loop or AGC subsystem. The two filters consume a large amount of space. The increased number of components also increases the likelihood of defects. It is also cumbersome to provide the switching circuitry necessary to switch between the two filters. Thus, both cost and quality are negatively affected by the fixed nature of the capacitor.

Other subsystems of the magnetic disc drive, for example, the servo subsystem, utilize filters with discrete components. In particular, they often use large capacitors in order to provide proper filtering actions for the subsystem. The use of these components in each of these subsystems presents the same problems as in the AGC subsystem and the phase lock loop subsystem. Discrete components take up more board space and thus cause the disc drive to be larger. In addition, since most of the subsystems are integrated, the discrete components require a second manufacturing step. This second manufacturing step increases drive costs and reduces quality.

SUMMARY OF THE INVENTION

The present invention relates to the subsystems of a disc drive. The subsystems of the disc drive control the operation of the disc drive and typically require the use of a filter. These filters, in the present invention, are fully integrated and include either a synthetic capacitor or a synthetic inductor.

In one preferred embodiment of the invention, the synthetic integrated circuit capacitor or inductor has two basic parts. The first is a small integrated circuit capacitor for providing a base value of capacitance. The second component is a set of electronic components which multiplies the base value of the capacitance of the small capacitor to provide a synthetic capacitance or to provide a synthetic inductance.

There are several embodiments for the invention which use amplifiers to multiply the base value of the capacitance of the small capacitor. In one embodiment, transconductance amplifiers create a fixed multiplier effect. In another, variable-gain transconductance amplifiers create a variable multiplier effect.

In one embodiment, a synthetic inductor is used in a filter in a phase locked loop subsystem. The phase locked loop uses the variable-gain transconductance amplifiers to vary the synthetic inductance. By adjusting the gain on each of the amplifiers, the multiplier effect is changed, thus changing the synthetic inductance. The ability to vary the synthetic inductance removes the need for two separate loop filters. Instead of switching between two filters, the phase locked loop simply varies the synthetic inductance. Thus, it is able to achieve increased performance in both the read data mode and the fast acquisition mode while using only one loop filter.

There are several techniques for varying the gain of the amplifiers. In one technique, controllable current sources are used to change the bias current to the amplifiers. A change in bias current to the amplifiers results in a change in gain.

The controllable current sources are, in one preferred embodiment, controlled by digital registers. These registers accept a digital code and output control signals to the current sources based on that code. There is a separate current source for each amplifier. Each of these current sources receives a separate control signal from the digital registers.

DETAILED DESCRIPTION OF THE PREFERRED EMBODIMENTS

Figure 1:
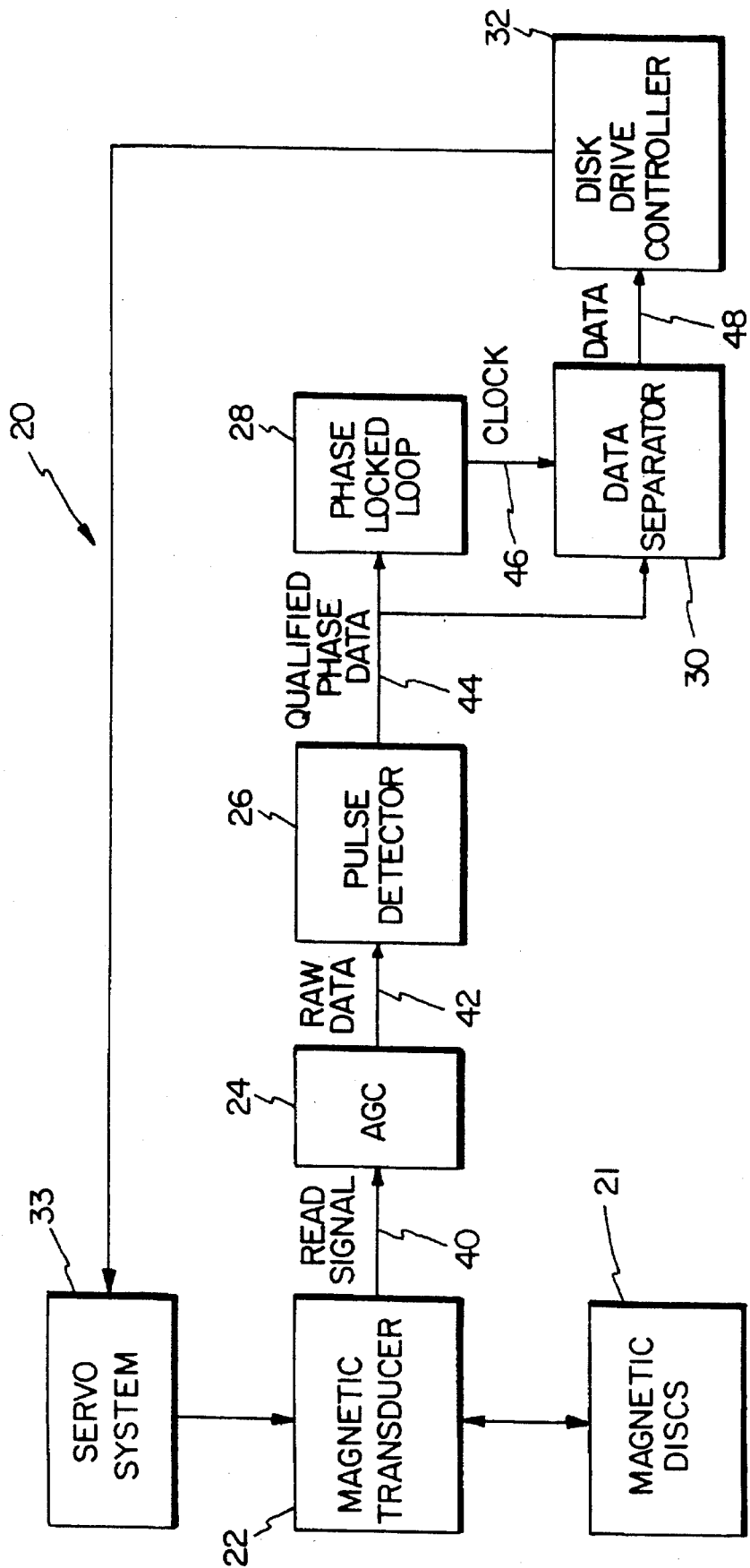
FIG. 1 is a block diagram of a data retrieval system for a disc drive.

FIG. 1 is a block diagram of data retrieval system 20 for a magnetic disc drive. Data retrieval system 20 comprises magnetic discs 21, magnetic transducer 22, automatic gain control circuit 24, pulse detector 26, phase locked loop 28, data separator 30, disc drive controller 32, and servo system 33.

Magnetic discs 21 are located adjacent to magnetic transducer 22 and may be read by magnetic transducer 22. Magnetic transducer 22 is coupled to automatic gain control circuit 24 and supplies read signal 40 to automatic gain control circuit 24. The magnetic transducer produces the read signal by sensing magnetic polarity transitions on one of magnetic discs 21, representative of information stored on magnetic discs 21, and by providing a series of electrical pulses (as the read signal) based on the polarity transitions.

Automatic gain control circuit 24 receives read signal 40, is coupled to pulse detector 26, and supplies raw data signal 42 to the pulse detector 26. Automatic gain control circuit 24 produces raw data signal 42 by modifying the amplitude of the peaks in read signal 40 so that all of the peaks are within a given range. This reduces unwanted amplitude variations due to uneven disc surfaces and unequal magnetic polarization strength.

Pulse detector 26 is coupled to phase locked loop 28 and data separator 30. Pulse detector 26 receives the raw data signal 42 and supplies qualified pulse data signal 44 to phase locked loop 28 and data separator 30. The pulse detector 26 produces qualified pulse data signal 44 by eliminating certain pulses from raw data signal 42. The elimination is performed by setting a threshold amplitude and then eliminating those pulses in the raw data signal 42 which do not meet that amplitude.

Phase locked loop 28 is coupled to data separator 30. Phase locked loop 28 receives qualified pulse data signal 44 and supplies clock signal 46 to the data separator 30. Clock signal 46 is typically a square wave generated by phase locked loop 28 with a frequency based on the frequency of the pulses in the qualified pulse data signal 44. Phase locked loop 28 adjusts the frequency of clock signal 46 to closely correspond to the frequency of pulses in qualified pulse data signal 44.

Data separator 30 is coupled to disc drive controller 32. Data separator 30 receives clock signal 46 and qualified pulse data signal 44 and supplies data signal 48 to the disc drive controller 32. Data separator 30 uses clock signal 46 to define a series of read windows in which to recover data pulses from the qualified pulse data signal 44. The data separator 30 produces data signal 48 by separating out pulses which do not properly occur within the read windows defined by data separator 30. Data signal 48 is representative of the data stored on the magnetic disc and is further processed by disc drive controller 32.

Disc drive controller 32 is connected with servo system 33. Servo system 33 receives control data from disc drive controller 32 and uses this data to control the operation of magnetic transducer 22. The control data is used to position magnetic transducer 22 with respect to magnetic discs 21.

Figure 2:
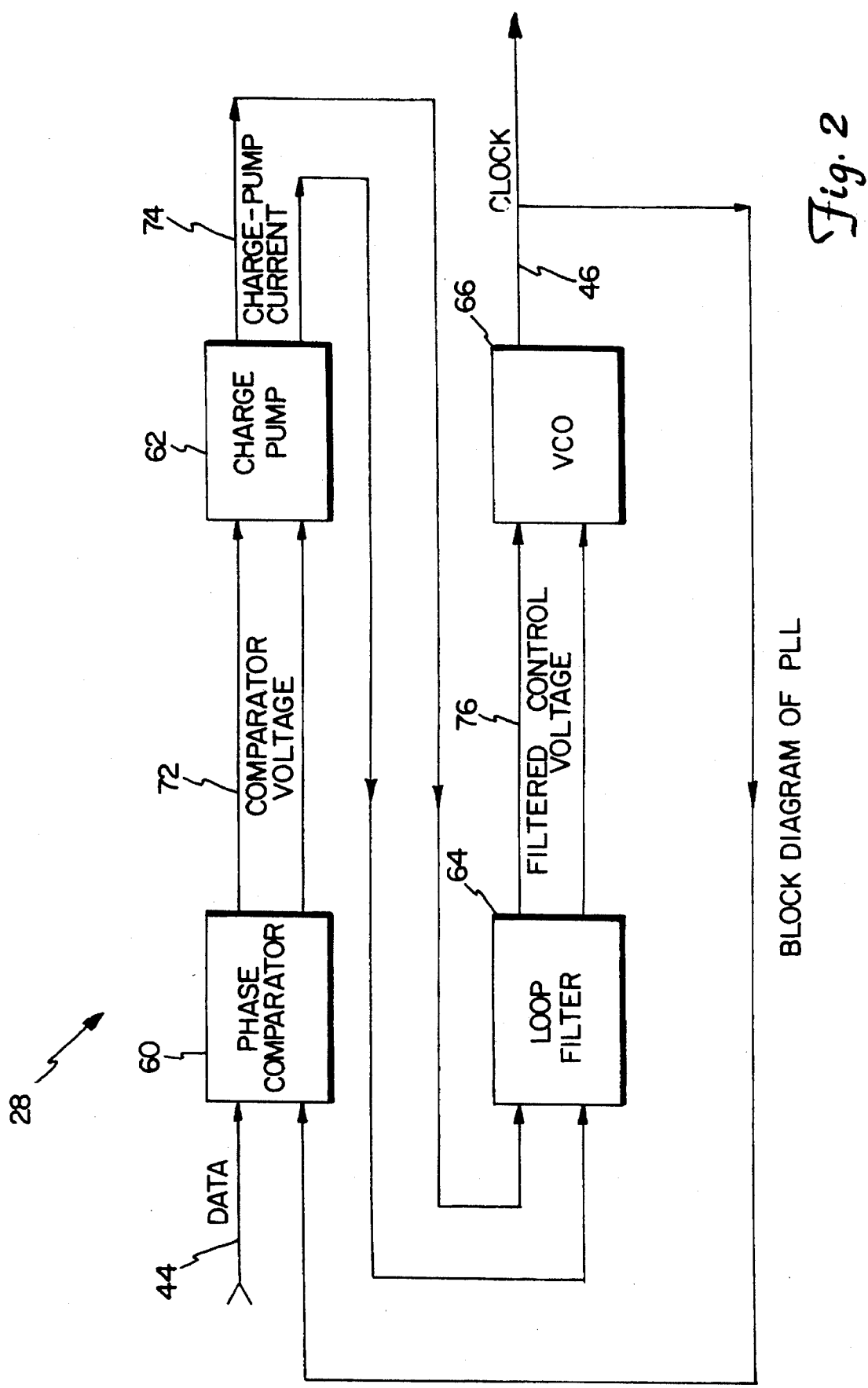
FIG. 2 is a more detailed block diagram of a phase locked loop used in the system of FIG. 1.

FIG. 2 is a more detailed block diagram of phase locked loop 28 of FIG. 1. Phase locked loop 28 comprises phase comparator 60, charge pump 62, loop filter 64, and voltage controlled oscillator 66. The operation of phase locked loop 28 is much the same as a traditional phase locked loop, with variations in the use and operation of loop filter 64.

Phase comparator 60 is coupled to pulse detector 26 (shown in FIG. 1) as well as charge pump 62 and voltage controlled oscillator 66 of FIG. 2. The phase comparator 60 receives qualified pulse data signal 44 from the pulse detector 26 and clock signal 46 from the voltage controlled oscillator 66. Based on the frequency and phase disparities between these two signals, the phase comparator 60 produces comparator voltage 72 which it supplies to charge pump 62. Comparator voltage 72 is indicative of the phase relationship of clock signal 46 and qualified pulse data signal 44.

Charge pump 62 is coupled to loop filter 64 and supplies charge pump current 74 to the loop filter 64. Charge pump 62 receives the comparator voltage 72 and produces charge pump current 74 based on the comparator voltage 72. Thus, the charge pump current 74 varies as the phase difference varies between the clock signal 46 and the qualified pulse data signal 44.

Loop filter 64 receives the charge pump current 74 and is, in turn, coupled to voltage controlled oscillator 66. Loop filter 64 supplies filtered control voltage 76 to the voltage controlled oscillator 66 as a function of the charge pump current 74. The filtered control voltage 76 provided to voltage controlled oscillator 66 controls the oscillation frequency of voltage controlled oscillator 66. Thus, the rate of change of the control voltage 76 at the output of loop filter 64 controls how quickly phase locked loop 28 reacts to changes in frequency in qualified pulse data signal 44.

Loop filter 64 dampens large current swings in charge pump current 74 to stabilize phase locked loop 28. Thus, filtered control voltage 76 is a stable voltage control for voltage controlled oscillator 66.

Voltage controlled oscillator 66 receives the filtered control voltage 76 and is coupled to phase comparator 60 and data separator 30 (shown in FIG. 1). Through a single output, the voltage controlled oscillator supplies clock signal 46 to both the phase comparator 60 and the data separator 30. Clock signal 46 is typically a square wave, generated by the voltage controlled oscillator 66, with a frequency based on filtered control voltage 76. Thus, the overall operation of phase locked loop 28 is similar to other commonly used phase locked loops.

Figure 3:
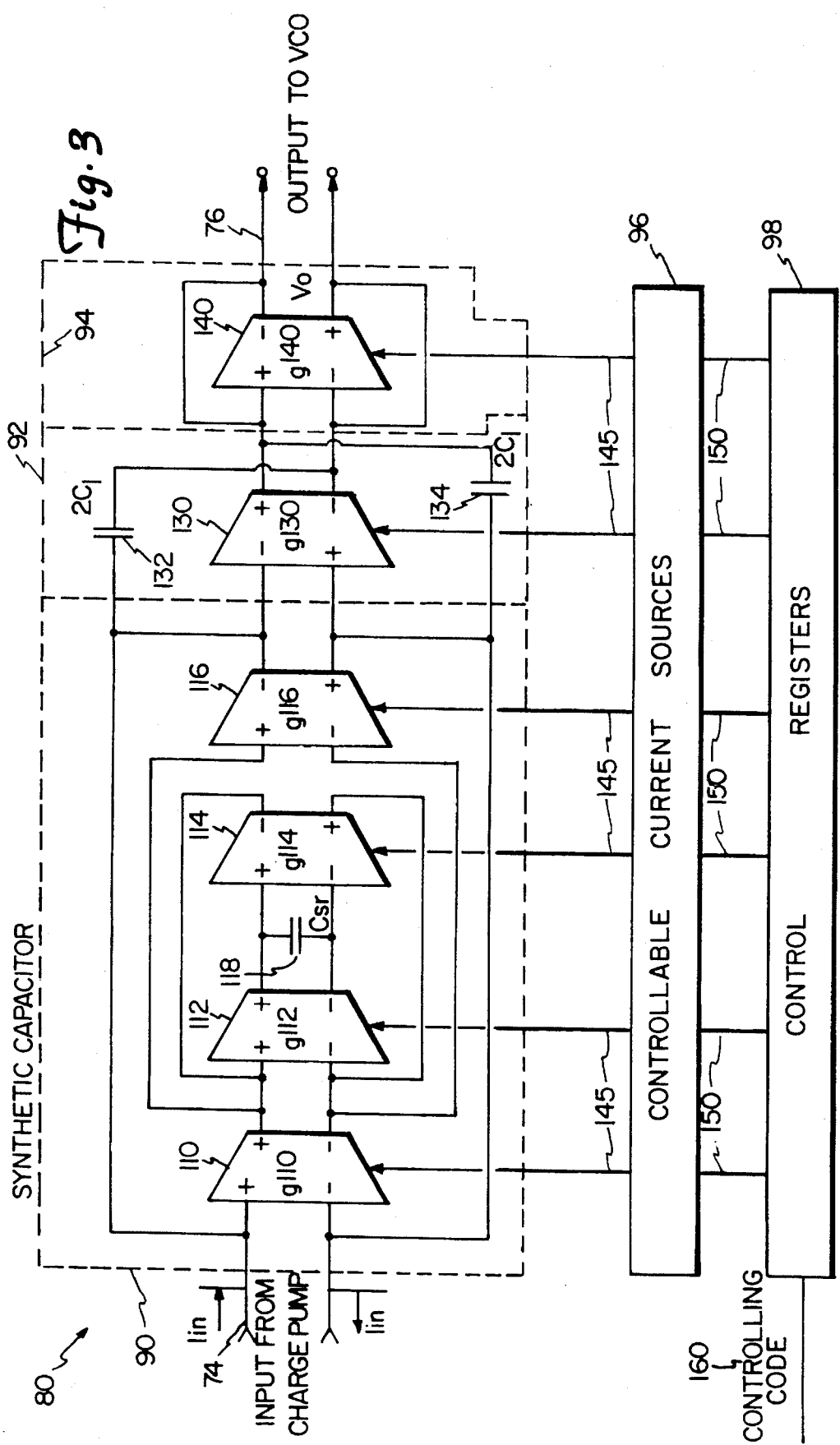
FIG. 3 is a more detailed block and circuit diagram of a loop filter used in the phase locked loop of FIG. 2.

FIG. 3 is a more detailed block diagram of a first embodiment of loop filter 64 of FIG. 2. FIG. 3 shows loop filter 80 which comprises synthetic capacitor 90, second stage 92, variable resistor 94, controllable current sources 96, and control registers 98. In this preferred embodiment, loop filter 80 is a second order filter.

Synthetic capacitor 90 is coupled to charge pump 62 of FIG. 2 and second stage 92. Synthetic capacitor 90 receives, as an input, charge pump current 74 and provides a synthetic capacitance as the first stage of the second order filter 80.

Second stage 92 also receives a part of the charge pump current 74 and is coupled to variable resistor 94 at the output. Second stage 92 comprises of transconductance amplifier 130 and capacitors 132 and 134 connected across corresponding inputs and outputs of the stage.

Variable resistor 94 receives an output from the second stage 92 and provides a filtered control voltage 76 to the voltage controlled oscillator 66 (shown in FIG. 3).

Synthetic capacitor 90 comprises transconductance amplifiers 110, 112, 114, and 116 and integrated circuit capacitor 118. Transconductance amplifiers 110, 112, 114, and 116 each have a negative and a positive input and a negative and a positive output. Capacitor 118 is coupled across the inputs of transconductance amplifier 114 and across the outputs of transconductance amplifier 112. Capacitor 118 provides a base capacitance for synthetic capacitor 90.

The negative and positive outputs of transconductance amplifier 112 are coupled to the negative and positive inputs of transconductance amplifier 114, respectively. The negative output of transconductance amplifier 114 is connected to the positive input of transconductance amplifier 112 and the positive output of transconductance amplifier 114 is coupled to the negative input of transconductance amplifier 112.

Transconductance amplifier 112 is coupled to transconductance amplifier 110 with the positive and negative inputs of transconductance amplifier 112 connected with the positive and negative outputs of transconductance amplifier 110, respectively.

The inputs of transconductance amplifier 110 are coupled to charge pump 62 of FIG. 2. In addition, the positive input of transconductance amplifier 110 is connected to the negative output of transconductance amplifier 116. The negative input of transconductance amplifier 110 is connected to the positive output of transconductance amplifier 116. The positive and negative outputs of transconductance amplifier 110 are connected to the positive and negative inputs of transconductance amplifier 116, respectively. The outputs of transconductance amplifier 116 are coupled to second stage 92.

Transconductance amplifiers 112 and 114 provide a divisional and invertor affect to the capacitance of capacitor 118. In other words, transconductance amplifiers 112 and 114 invert the capacitance of capacitor 118 and reduce that inverted capacitance.

Transconductance amplifiers 110 and 116 invert the inverted-reduced capacitance produced by transconductance amplifiers 112 and 114 and capacitor 118. Transconductance amplifiers 110 and 116 also multiply this capacitance. The degree to which amplifiers 110 and 116 multiply the inverted-reduced capacitance is determined by the gain of the amplifiers and will be described in greater detail later in the specification.

Controllable current sources 96 are coupled to transconductance amplifiers 110, 112, 114, 116, 130 and 140. Controllable current sources 96 provide bias currents 145 to the transconductance amplifiers. Control registers 98 are coupled to controllable current sources 96 and provide code signals 150. Code signals 150 control the amount of current produced by controllable current sources 96. Control registers 98 provide code signals 150 based on controlling code 160 which can be provided to control registers 98 by either disc drive controller 32 or by an external host system (not shown).

Within synthetic capacitor 90, bias currents 145 provided by controllable current sources 96 determine the gain of transconductance amplifiers 110, 112, 114, and 116. Changes in bias currents 145 produce independent changes in the gain of transconductance amplifiers 110, 112, 114, and 116. The gains in the amplifiers are governed by the equation:

$$g_m = hI_b \qquad \text{Eq. 1}$$

where $g_m$ is the gain of the transconductance amplifier;

h is the proportionality constant of the transconductance amplifier; and $I_b$ is the bias current to the transconductance amplifier.

Variations in the gains of these transconductance amplifiers create changes in the size of synthetic capacitor 90 through the equation:

$$C_{s90} = \frac{g_{110} g_{116}}{g_{112} g_{114}} C_{118} \qquad \text{Eq. 2}$$

where $g_{110}$, $g_{112}$, $g_{114}$, and $g_{116}$ are the gains of transconductance amplifiers 110, 112, 114, and 116, respectively;

$C_{118}$ is the capacitance of capacitor 118; and $C_{s90}$ is the synthetic capacitance of synthetic capacitor 90.

Thus, by programming control registers 98 properly, the capacitance of synthetic capacitor 90 can be changed to meet desired parameters.

Within variable resistor 94, bias current 145 controls the gain of transconductance amplifier 140. Variations in the gain of transconductance amplifier 140 create different resistance values for variable resistor 94 according to the equation:

$$R_{s94} = \frac{1}{g_{140}} \qquad \text{Eq. 3}$$

Where $R_{s94}$ is the synthetic resistance of resistor 94; and $g_{140}$ is the gain of transconductance amplifier 140.

Thus, the resistance is controlled by bias current 145.

Within second stage 92, bias current 145 varies the gain of transconductance amplifier 130. The gain of transconductance amplifier 130 controls the characteristic of second stage 92 in the second order loop filer 80 and the overall stability of the filter.

The transfer function of the filter shown in FIG. 3 is that of a typical lead-lag filter used in phase locked loops:

$$\frac{V_{out}}{I_e} = \frac{s + \frac{2g_{130}}{C_{132}}}{sC_{s90}\left[s + \frac{g_{140}\left(C_{s90} + \frac{C_{132}}{2}\right) - g_{130} \cdot \frac{C_{132}}{2}}{C_{s90} \frac{C_{132}}{2}}\right]} \qquad \text{Eq. 4}$$

where all parameters (excluding integral capacitors $C_{132}$, $C_{134}$) are controlled during operation.

The use of synthetic parameters in a phase locked loop provides two distinct advantages over previous phase locked loops. First, it integrates the loop filter which allows the phase locked loop to be smaller and cheaper. Second, it provides a controllable loop filter. This control provides better performance in all modes of operation, and eliminates the need for switching components and multiple loop filters. The elimination of these components reduces the size and cost of the phase locked loop.

Figure 4:
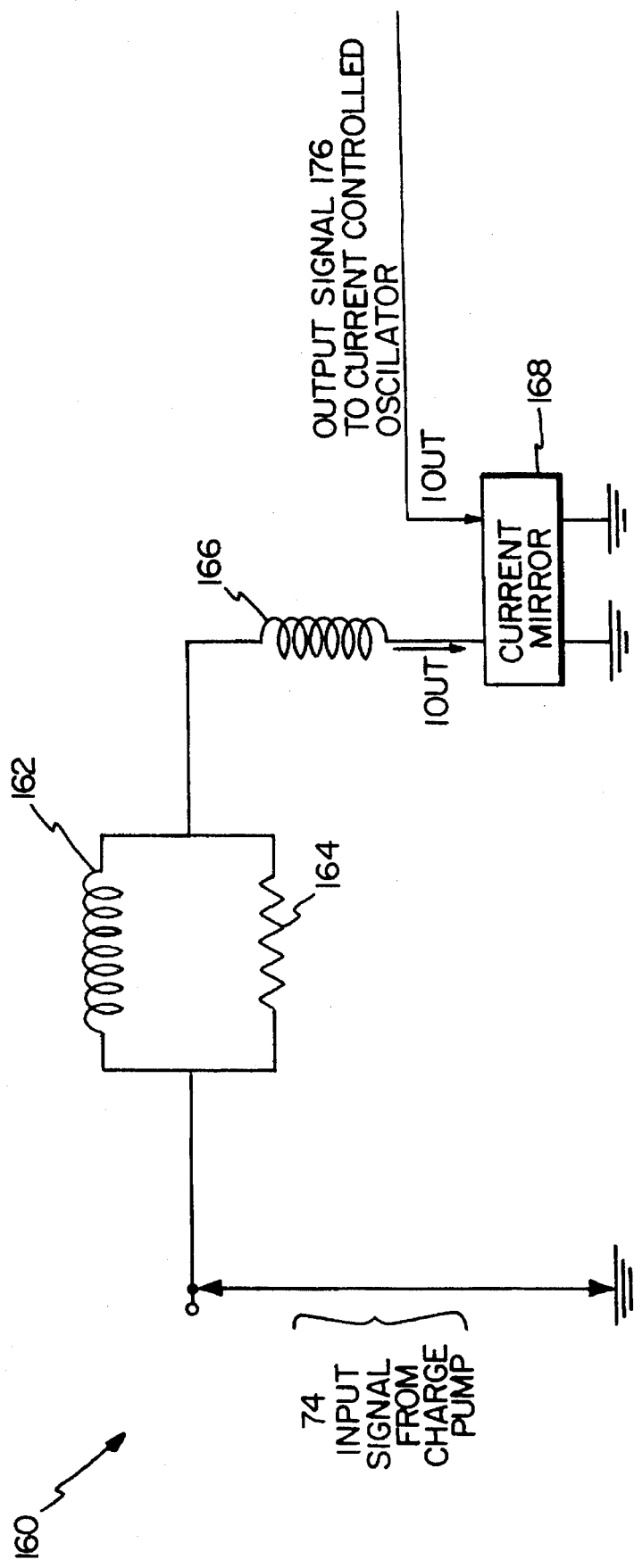
FIG. 4 is an alternative block and circuit diagram of a loop filter used in the phase locked loop of FIG. 2.

FIG. 4 is an alternative embodiment of loop filter 64 of FIG. 2. FIG. 4 shows loop filter 160 which uses a discrete component R-L filter. Loop filter 160 comprises inductor 162, resistor 164, inductor 166, and current mirror 168. Loop filter 160 receives input signal 74 from charge pump 62 of FIG. 2. Input signal 74 is coupled to one side of both inductor 162 and resistor 164. The opposite sides of both inductor 162 and resistor 164 are coupled to one side of inductor 166. The opposite side of inductor 166 is coupled to current mirror 168. Output 176 from current mirror 168 is attached to a current control oscillator similar to voltage control oscillator 66 of FIG. 2.

Loop filter 160 of FIG. 4 provides proper filtering action for the phase locked loop subsystem. However, R-L discrete phase locked loop filters are not usually used in disc drives. R-L filters are not used because of the substantial non-idealities and high cost of discrete inductors. Thus, synthetic inductors offer a positive alternative.

Figure 5:
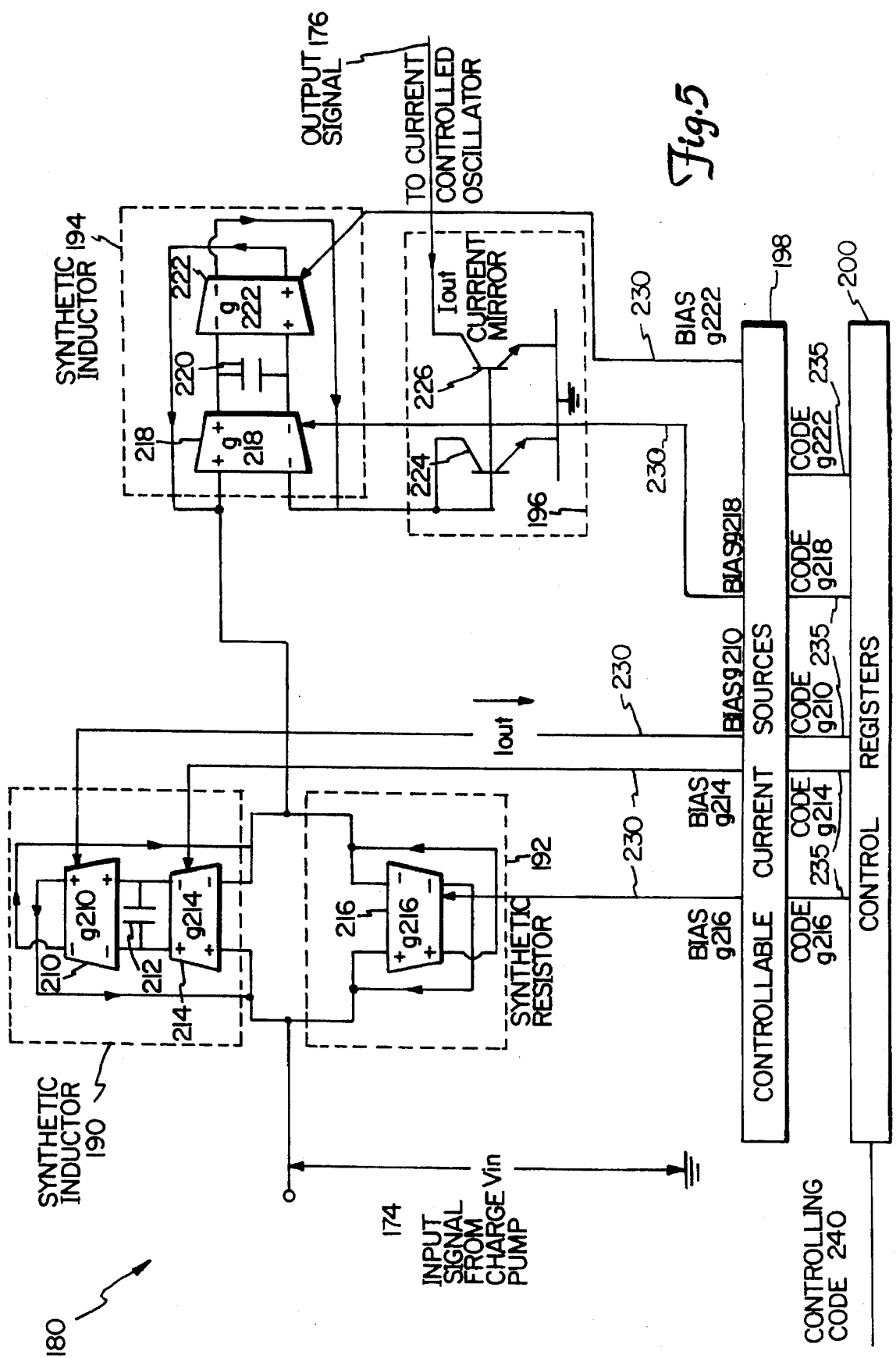
FIG. 5 is also an alternative embodiment of a diagram of a loop filter used in the phase locked loop of FIG. 2.

FIG. 5 is an alternative embodiment of loop filter 160 of FIG. 4. FIG. 5 shows loop filter 180 which uses synthetic inductors in place of the discrete elements. Loop filter 180 comprises synthetic inductor 190, synthetic resistor 192, synthetic inductor 194, current mirror 196, controllable current sources 198, and control registers 200. In the preferred embodiment, loop filter 180 is a monolithic filter.

Synthetic inductor 190 is coupled to synthetic resistor 192. Both synthetic inductor 190 and synthetic resistor 192 receive input signal 74 from charge pump 62 of FIG. 2. In this embodiment, input signal 74 from the charge pump is a signal which represents the phase of the data signal provided to phase comparator 60. Both synthetic inductor 190 and synthetic resistor 192 are coupled to synthetic inductor 194. Synthetic inductor 194 is coupled to current mirror 196. Output signal 176 from current mirror 196 is sent to a current controlled oscillator.

Synthetic inductor 190 comprises transconductance amplifiers 210 and 214 and integrated circuit capacitor 212. Both transconductance amplifiers 210 and 214 have a negative and a positive input and a negative and a positive output. Capacitor 212 is coupled across the inputs of transconductance amplifier 210 and across the outputs of transconductance amplifier 214. Capacitor 212 provides a base capacitance for synthetic inductor 190.

The negative and positive outputs of transconductance amplifier 214 are coupled to the negative and positive inputs of transconductance amplifier 210, respectively. The negative output of transconductance amplifier 210 is connected to the negative input of transconductance amplifier 214. The positive output of transconductance amplifier 210 is connected to the positive input of transconductance amplifier 214.

Synthetic resistor 192 comprises transconductance amplifier 216. Transconductance amplifier 216 has a negative and a positive input and a negative and a positive output. The negative and positive outputs of transconductance amplifier 214 are coupled to the negative and positive inputs of transconductance amplifier 216, respectively. The negative output of transconductance amplifier 216 is connected to the positive input of transconductance amplifier 216. The positive output of transconductance amplifier 216 is connected to the negative input of transconductance amplifier 216.

Synthetic inductor 194 comprises transconductance amplifiers 218 and 222 and integrated circuit capacitor 212. Transconductance amplifiers 218 and 222 each have a negative and a positive input and a negative and a positive output. The negative inputs of both transconductance amplifiers 214 and 216 are connected to the positive input of transconductance amplifier 218. The positive input of transconductance amplifier 218 is also connected to the positive output of transconductance amplifier 222. The negative input of transconductance amplifier 218 is connected to the negative output of transconductance amplifier 222. The positive output of transconductance amplifier 218 is connected to the negative input of transconductance amplifier 222. The negative output of transconductance amplifier 218 is connected to the positive input of transconductance amplifier 222. Capacitor 220 is coupled across the inputs of transconductance amplifier 222 and across the outputs of transconductance amplifier 218.

Current mirror 196 comprises transistor 224 and transistor 226. Both transistor 224 and transistor 226 have a collector terminal, a base terminal, and an emitter terminal.

The negative output of transconductance amplifier 222 is connected to the base terminal of transistor 224. The base terminal of transistor 224 is coupled to the collector terminal of transistor 224. The emitter terminal of transistor 224 is connected to emitter terminal of transistor 226. The base terminals of transistors 224 and 226 are coupled together. The collector terminal of transistor 226 is connected to the current control oscillator and carries output signal 176.

Controllable current sources 198 are coupled to transconductance amplifiers 210, 214, 216, 218, and 222. Controllable current sources 198 provide bias currents 230 to the transconductance amplifiers. Control registers 200 are coupled to controllable current sources 198 and provide code signals 235. Code signals 235 control the amount of current produced by controllable current sources 198. Control registers 200 provide code signals 235 based on controlling code 240 which can be provided to control registers 200 by either disc drive controller 32 or by an external host system (not shown).

Within synthetic inductor 190, bias currents 230 provided by controllable current sources 198 determine the gain of transconductance amplifiers 210, 214, 216, 218, and 222. Changes in bias currents 230 produce independent changes in the gain of transconductance amplifiers 210, 214, 216, 218, and 222. The gains in the amplifiers are governed by equation 1 above.

Variations in the gains of these transconductance amplifiers create changes in the size of synthetic inductor 190 according to the equation:

$$L_{s190} = \frac{C_{212}}{g_{214} g_{210}} \quad \text{Eq. 5}$$

where $g_{210}$ and $g_{214}$ are the gains of transconductance amplifiers 210 and 214, respectively;

$C_{212}$ is the capacitance of capacitor 212; and $L_{s190}$ is the synthetic inductance of synthetic inductor 190.

Thus, by programming control registers 200, the inductance of synthetic inductor 190 can be changed to meet desired parameters.

Similarly, within synthetic resistor 192, bias currents 230 provided by controllable current sources 198 varies the gain of transconductance amplifier 216. The gain of transconductance amplifier 216 controls the characteristics of synthetic resistor 192. Thus, the resistance is controlled by bias current 230.

Variations in the gain of this transconductance amplifier creates changes in the size of synthetic resistor 192 according to the equation:

$$R_{s192} = \frac{1}{g_{216}} \quad \text{Eq. 6}$$

where $g_{216}$ is the gain of transconductance amplifier 216; and $R_{s192}$ is the synthetic resistance of synthetic resistor 192.

Thus, by programming control registers 200 properly, the resistance of synthetic resistor 192 can be changed to the desired parameters.

Within synthetic inductor 194, bias current 145 varies the gain of transconductance amplifiers 218 and 222. The gains of transconductance amplifiers 218 and 222 control the characteristics of synthetic inductor 194 according to the equation:

$$L_{s194} = \frac{C_{220}}{g_{218} g_{222}} \quad \text{Eq. 7}$$

where $g_{218}$ and $g_{222}$ are the gains of transconductance amplifiers 218 and 222, respectively;

$c_{220}$ is the capacitance of capacitor 220; and $L_{s194}$ is the synthetic inductance of synthetic inductor 194.

Thus, by programming control registers 200, the inductance of synthetic inductor 194 can be changed to meet desired parameters.

The use of synthetic inductors in a phase locked loop filter provides the same advantages that the use of synthetic capacitors provide. First, it allows the loop filter to be integrated which allows the phase locked loop to be smaller and cheaper. Second, it provides a controllable loop filter. This control provides better performance in all modes of operation, and eliminates the need for switching components and multiple loop filters. The elimination of these components reduces the size and cost of the phase locked loop.

In addition to the above improvements, the use of synthetic inductors also provide an advantage that cannot be achieved with the use of synthetic capacitors. Synthetic inductors are less sensitive to transconductor parasitics than are synthetic capacitors. Thus, synthetic inductors provide better and more accurate control for the circuits in which they are used.

Figure 6:
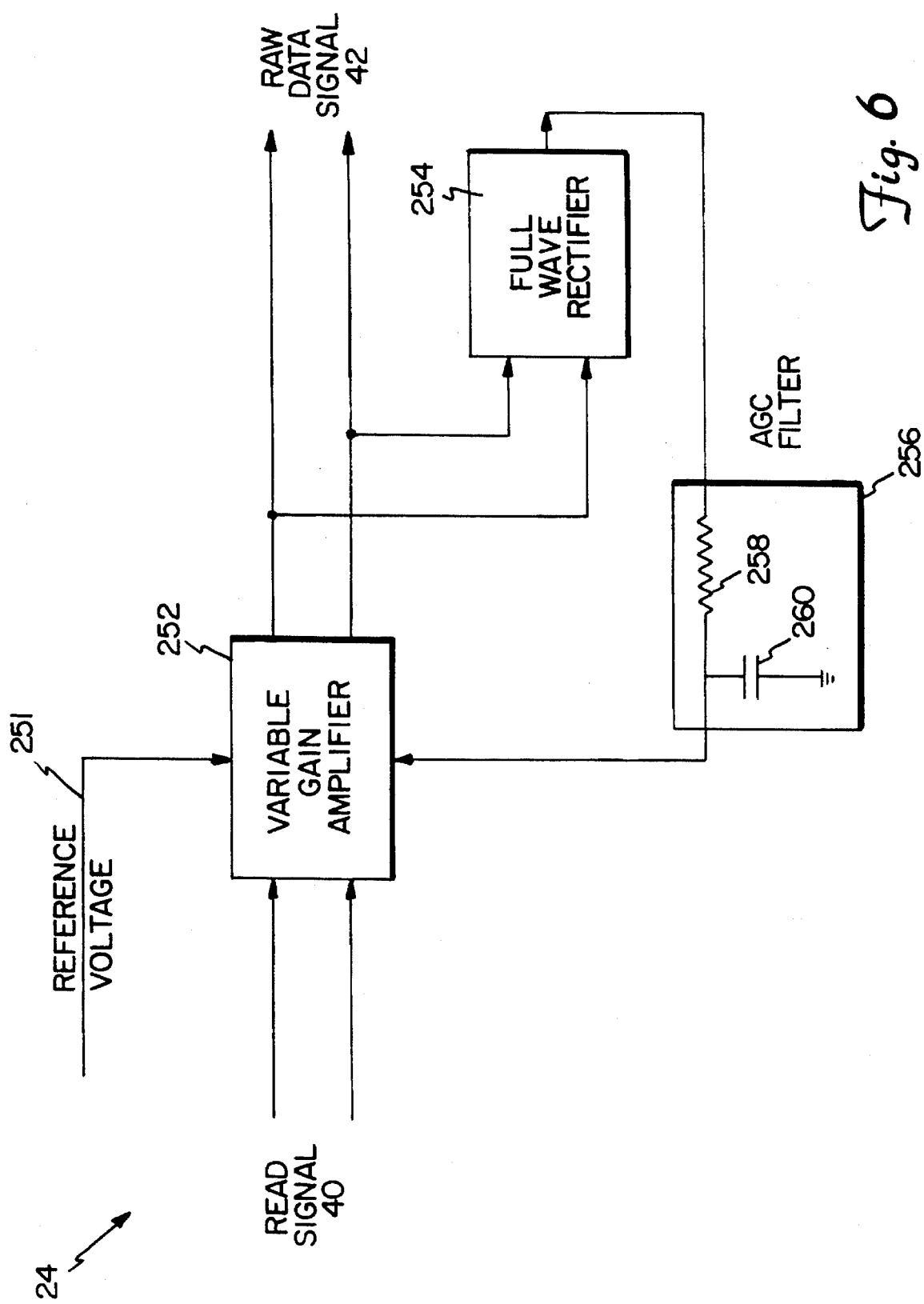
FIG. 6 is a more detailed block diagram of an automatic gain control circuit used in the system of FIG. 1.

Not only can the filters of the present invention be used with the phase locked loop subsystems, they can be used in any disc drive subsystem. For example, FIG. 6 is a more detailed block diagram of automatic gain control circuit 24 of FIG. 1. Automatic gain control circuit 24 comprises variable-gain amplifier 252, full-wave rectifier 254, and automatic gain control filter 256. Automatic gain control filter 256 comprises resistor 258 and capacitor 260. The operation of automatic gain control circuit 24 is much the same as traditional automatic gain control circuits, with variations in the use and operation of automatic gain control filter 256.

Variable-gain amplifier 252 is coupled at its input to magnetic transducer 22 (shown in FIG. 1) and at its output to full-wave rectifier 254. The output of full wave rectifier 254 is connected to the input of automatic gain control filter 256. The output of automatic gain control filter 256 is then fed back to variable-gain amplifier 252. Read signal 40 is provided to variable-gain amplifier 252 from magnetic transducer 22. Reference voltage 251 is also provided to variable-gain amplifier 252 from a suitable voltage source. Variable-gain amplifier 252 produces raw data signal 42 at its output and provides raw data signal 42 to pulse detector 26 (shown in FIG. 1).

Incoming read signal 40 often has varying peak-to-peak amplitudes due to, among other things, differing characteristics of magnetic transducer 22. Magnetic transducer 22 varies in temperature in surface characteristics and in flying height. Since the remaining subsystems of data retrieval system 20 of FIG. 1 (e.g., phase locked loop 28 and servo system 33) require a read signal with a relatively constant peak-to-peak amplitude, automatic gain circuit 24 modifies the amplitude of read signal 40 to contain peak-to-peak amplitudes within a desired range.

Read signal 40 is first fed into variable-gain amplifier 252. The voltage gain of variable-gain amplifier 252 is controlled by reference voltage 251. The signal amplitude of raw data signal 42 is rectified by full-wave rectifier 254 and filtered by automatic gain control filter 256. Full-wave rectifier 254 and automatic gain control filter 256 act to effectively compare the amplitude of raw data signal 42 to a preassigned set point and feed the difference between the amplitude of raw data signal 42 and the preassigned set point back to variable-gain amplifier 252.

Automatic gain control filter 256 is a low pass R-C passive filter of first order with resistor 258 and capacitor 260. Automatic gain control filter 256 provides the proper filtering for automatic gain control circuit 24.

Figure 7:
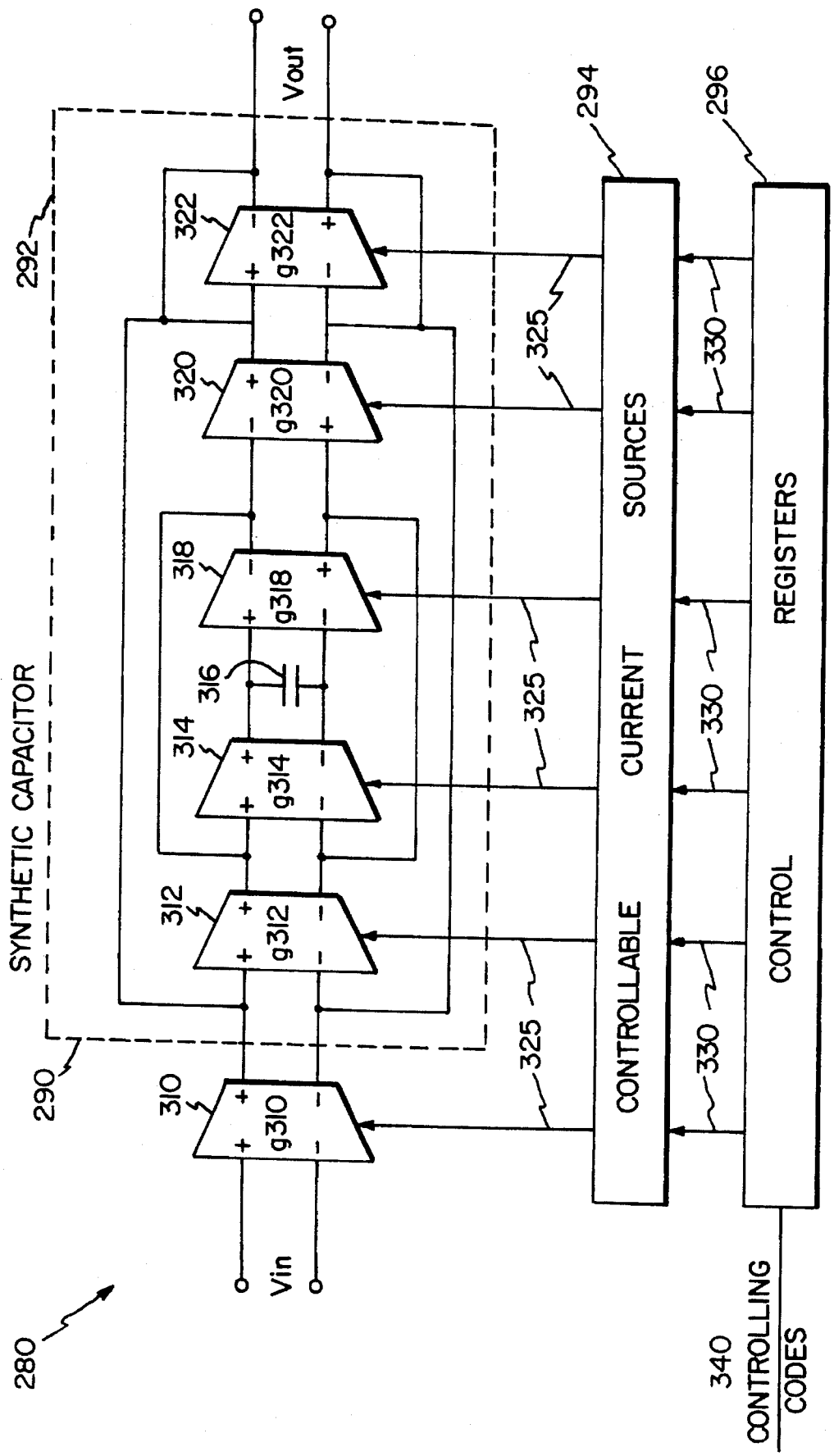
FIG. 7 is a more detailed block and circuit diagram of an automatic gain control filter used in the automatic gain control circuit of FIG. 6.

FIG. 7 is a first embodiment of automatic gain control filter 256 of FIG. 6, according to the present invention. FIG. 7 shows automatic gain control filter 280 which uses a synthetic capacitor and a synthetic resistor in place of the discrete elements. Automatic gain control filter 280 comprises transconductance buffer 310, synthetic capacitor 290, synthetic resistor 292, controllable current sources 294, and control registers 296. The transconductance buffer 310 provides an interface between full-wave rectifier 254 of FIG. 6 and a parallel synthetic RC circuit $R_{s292}$ $C_{s290}$. Output of this parallel circuit supplies a filtered control voltage to the variable gain amplifier 252 (shown in FIG. 6).

Synthetic capacitor 290 comprises transconductance amplifiers 312, 314, 318 and 320 and integrated circuit capacitor 316. Synthetic capacitor 290 operates in a manner similar to synthetic capacitor 90 shown in FIG. 3.

Variable resistor 292 comprises transconductance amplifier 322 connected as a variable resistor. Variable resistor 292 operates in a similar manner as variable resistor 94 shown in FIG. 3.

Controllable current sources 294 are coupled to transconductance amplifiers 310, 312, 314, 318, 320 and 322. Controllable current sources 294 provide bias currents 325 to the transconductance amplifiers. Control registers 296 are coupled to the controllable current sources 294 and provide code signals 330. Code signals 330 control the amount of current produced by controllable current sources 294. Control registers 296 provide code signals 330 based on controlling code 340 which can be provided to control registers 296 by either disc drive controller 32 or by an external host system (not shown).

Within synthetic capacitor 290, bias currents 325 provided by controllable current sources 294 determine the gain of transconductance amplifiers 312, 314, 318, 320. The gains in the amplifiers are governed by Equation 1 given above.

Variations in the gains of these transconductance amplifiers creates changes in the size of synthetic capacitor 290 according to the equation:

$$C_{S290} = \frac{g_{320}\, g_{312}}{g_{314}\, g_{318}} \cdot C_{316} \qquad \text{Eq. 8}$$

where $g_{312}$, $g_{314}$, $g_{318}$, $g_{320}$ are the gains of transconductance amplifiers 312, 314, 318, 320, respectively;

where $C_{316}$ is the capacitance of capacitor 316; and $C_{s290}$ is the synthetic capacitance of synthetic capacitor 290.

Thus, by programming control registers 296, the capacitance of synthetic capacitor 290 can be changed to meet parameters desired for AGC filter 256.

Within variable resistor 292, bias current 325 controls the gain of transconductance amplifier 322. Variations in the gain of transconductance amplifier 322 create different resistance values for variable resistor 292. Thus, the resistance is controlled by bias current 325.

The use of a synthetic capacitor in an automatic gain control circuit 256 provides similar advantages over the previous automatic gain control circuits as do synthetic capacitors in a phase locked loop filter 64.

Figure 8:
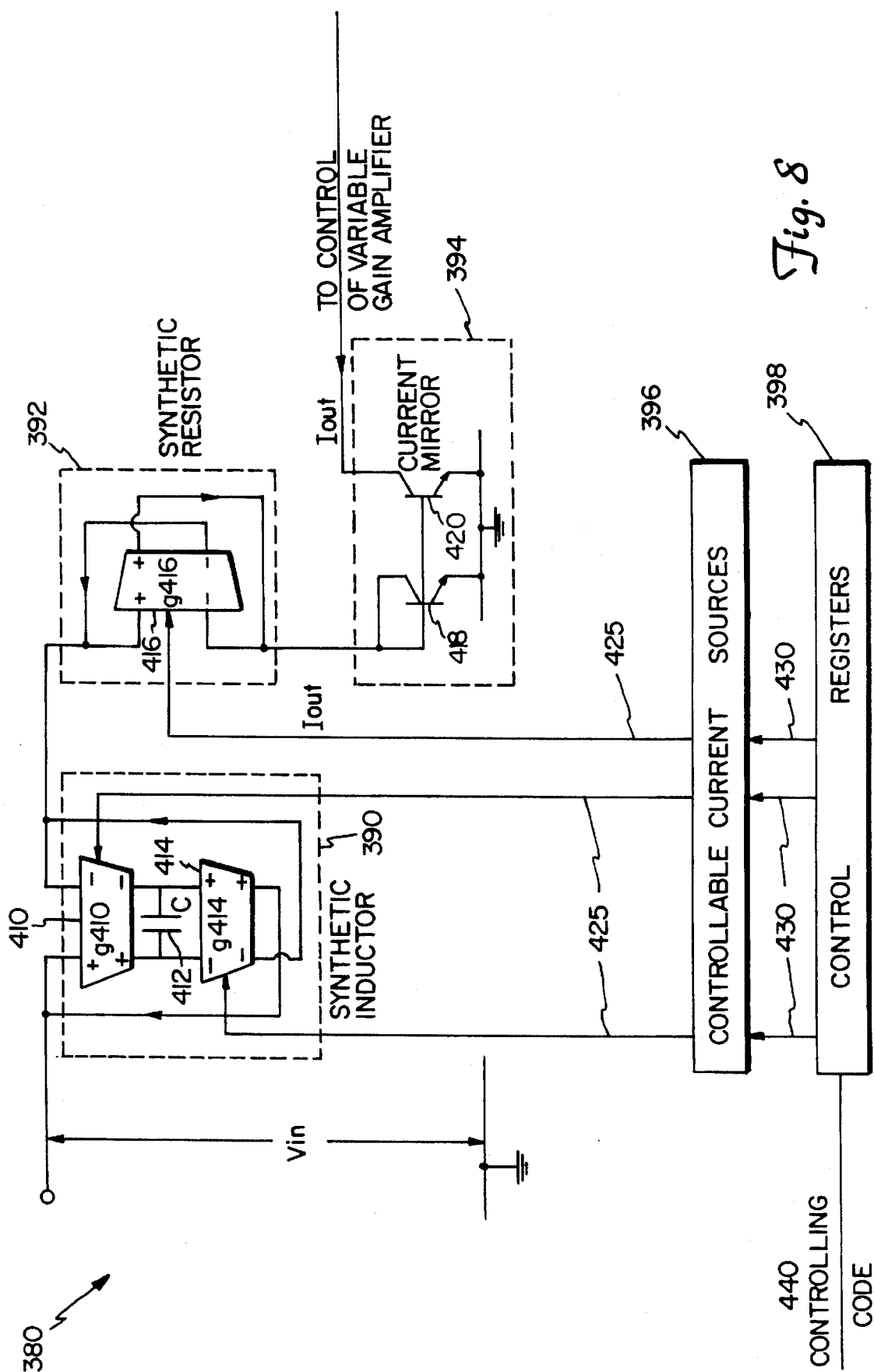
FIG. 8 is an alternative block and circuit diagram of an automatic gain control filter used in the automatic gain control circuit of FIG. 6.

FIG. 8 is an alternative embodiment of automatic gain control filter 256 of FIG. 6. In this embodiment, automatic gain control filter 380 uses synthetic inductors in place of synthetic capacitors. Automatic gain control filter 380 comprises synthetic inductor 390, synthetic resistor 392, current mirror 394, controllable current sources 396, and control registers 398.

Synthetic inductor 390 receives an input signal from full-wave rectifier 254 of FIG. 6. Synthetic inductor 390 is also coupled to synthetic resistor 392. Synthetic resistor 392 is coupled to current mirror 394. The output from current mirror 394 is sent to variable-gain amplifier 252 of FIG. 6.

Synthetic inductor 390 comprises transconductance amplifiers 410 and 414 and integrated circuit capacitor 412 and operates similar to synthetic inductors 190 and 194 discussed with respect to FIG. 5. Synthetic resistor 392 comprises transconductance amplifier 416 and operates similar to synthetic resistor 192 in FIG. 5. Current mirror 494 comprises transistor 418 and transistor 420 and operates similar to current mirror 230 shown in FIG. 5.

Controllable current sources 396 are coupled to transconductance amplifiers 410, 412, and 416. Controllable current sources 396 provide bias currents 425 to the transconductance amplifiers. Control registers 398 are coupled to controllable current sources 396 and provide code signals 430. Code signals 430 control the amount of current produced by controllable current sources 396. Control registers 398 provide code signals 430 based on controlling code 440 which can be provided to control registers 398 by either disc drive controller 32 or by an external host system (not shown).

Within synthetic inductor 390, bias currents 425 provided by controllable current sources 396 determine the gain of transconductance amplifiers 410, 414. The changes in bias currents 425 produce independent changes in the gain of transconductance amplifiers 410, 414. The gains in the amplifiers are governed by Equation 1 above.

Variations in the gains of these transconductance amplifiers create changes in the size of synthetic inductor 390 according to the equation:

$$L_{S390} = \frac{C_{412}}{g_{414} g_{410}} \qquad \text{Eq. 9}$$

where $g_{410}$ and $g_{414}$ are the gains of transconductance amplifiers 410 and 414, respectively;

$C_{412}$ is the capacitance of capacitor 412; and $L_{S390}$ is the synthetic inductance of synthetic inductor 390.

Thus, by programming control registers 398, the inductance of synthetic inductor 390 can be changed to meet desired parameters.

Similarly, within synthetic resistor 392, bias currents 425 provided by controllable current sources 396 varies the gain of transconductance amplifier 416. The gain of transconductance amplifier 416 controls the characteristics of synthetic resistor 392. Thus, the resistance is controlled by bias current 425.

Variations in the gain of this transconductance amplifier creates changes in the size of synthetic resistor 392 according to the equation:

$$R_{S392} = \frac{1}{g_{416}} \qquad \text{Eq. 10}$$

where $g_{416}$ is the gain of transconductance amplifier 416; and $R_{S392}$ is the synthetic resistance of synthetic resistor 392.

Thus, by programming control registers 398, the resistance of synthetic resistor 392 can be changed to the desired parameters.

The use of synthetic inductors in an automatic gain control filter provides the same advantages that the use of them in the phase locked loop filter provides. The filters may be integrated, they will be controllable, and they will be less sensitive to transconductor parasitics.

It should be noted that, while the synthetic resistor, synthetic capacitor and synthetic inductor filters of the present invention have been described as implemented in certain disc drive subsystems (i.e., the phase locked loop and automatic gain control subsystems) it should be recognized that the present invention can be used in any other disc drive subsystem to provide the same advantages. For instance, the present invention could be implemented in servo subsystem 33 to achieve an improved subsystem.

Although the present invention has been described with reference to preferred embodiments, workers skilled in the art will recognize that changes may be made in form and detail without departing from the spirit and scope of the invention.

What is claimed is:

1. An integrated circuit filter for a data retrieval system, the integrated circuit filter comprising a plurality of synthetic components, each synthetic component having first and second terminal means between which the synthetic component behaves as a passive circuit component, each synthetic component having an impedance selectable independently of signals communicated to either the first or second terminal means, the plurality of synthetic components including a synthetic inductor, one of the plurality of components comprising:

a passive circuit component of a selected impedance value;

amplification means comprising a plurality of amplifiers, each amplifier having respective input means for receiving input signals, respective control means for receiving control signals determinative of a respective multiplicative factor, and respective output means for outputting signals representative of the input signals scaled by the respective multiplicative factor, each amplifier having either its input or output means coupled to either the input or output means of another amplifier of the plurality, one amplifier of the plurality having either its input or output means coupled to either of the first or second terminal means and one amplifier of the plurality coupled to the passive circuit component; and selection means coupled to each control means, for selecting each multiplicative factor independent of signals communicated to either of the first and second terminal means, the impedance of the synthetic component based on each multiplicative factor and the selected impedance value of the passive circuit component.

2. A disc drive system, comprising:

a magnetic disc having a surface for storing information;

a magnetic transducer, proximate the magnetic disc, for flying above the surface of the magnetic disc and producing a read signal indicative of information stored on the magnetic disc;

a plurality of subsystems coupled to the magnetic transducer to receive the read signal, the plurality of subsystems processing the read signal to provide a data signal, based on the read signal, the data signal being indicative of the information stored on the magnetic disc, at least one of the plurality of subsystems including a filter circuit having a synthetic component having first and second terminals between which the synthetic component behaves as a passive circuit component, the synthetic component having an impedance selectable independently of signals communicated to either of the first and second terminal means, the synthetic component including:

a passive circuit component of a selected impedance value;

amplification means comprising a plurality of amplifiers, each amplifier having respective input means for receiving input signals, respective control means for receiving control signals determinative of a respective multiplicative factor, and respective output means for outputting signals representative of the input signals scale by the respective multiplicative factor, each amplifier having either of its input or output means coupled to either of the input or output means of another amplifier of the plurality, one amplifier of the plurality having either its input and output means coupled to either of the first or second terminal means, and one amplifier of the plurality coupled to the passive circuit component; and selection means coupled to each control means, for selecting each multiplicative factor independent of signals communicated to either of the first and second terminal means, the impedance of the synthetic component based on each multiplicative factor and the selected impedance value of the passive circuit component;

a disc drive controller, coupled to at least one of the plurality of subsystems, to receive the data signal; and a servo system coupled to the disc drive controller and the magnetic transducer, the servo system receiving position information from the disc drive controller and positioning the magnetic transducer relative to the magnetic disc based on the position information.

3. The disc drive system of claim 2 wherein the control means includes:

a plurality of controllable current sources coupled to the plurality of amplifiers; and current source controlling means, coupled to the plurality of controllable current sources, for controlling the current of the plurality of controllable current sources.

4. The disc drive system of claim 3 wherein the current source controlling means includes:

a plurality of control registers, coupled to the plurality of controllable current sources, to provide independent control of each controllable current source.

5. The disc drive system of claim 2 wherein the plurality of amplifiers includes a plurality of transconductance amplifiers.

6. The disc drive system of claim 2 wherein the impedance of the synthetic component is an inductive impedance and the selected passive circuit component is a capacitor.

7. The disc drive system of claim 6 wherein C and $L_s$ are respectively representative of the selected impedance value of the passive circuit component and the impedance of the synthetic component and wherein the plurality of amplifiers includes:

first and second amplifiers having respective input means for receiving input signals, respective control means for receiving-signals determinative of respective multiplicative factors g1 and g2, and respective output means for outputting signals representative of the input signals scaled by the respective multiplicative factor, the respective control means coupled only to the selection means for selecting the respective multiplicative factors g1 and g2 independent of signals communicated to either of the first and second terminal means, the indicative impedance of the synthetic component based on $$L_s = \frac{C}{g1g2}.$$

8. The disc drive system of claim 2 wherein the impedance of the synthetic component is a resistive impedance.

9. The disc drive system of claim 2 wherein the filter circuit is a loop filter in a phase locked loop for controlling a phase relationship between a data signal and a clock signal, the phase locked loop comprising:

a phase comparator for comparing the data signal and the clock signal and providing a phase comparator output;

a charge pump, coupled to the phase comparator, for providing a charge pump output to the loop filter based on the phase comparator output; and a voltage controlled oscillator, coupled to the loop filter and the phase comparator, for providing the clock signal with a clock frequency as a function of the control voltage.

10. A phase locked loop in a disc drive for controlling a phase relationship between a data signal and a clock signal, the phase locked loop comprising:

a phase comparator for comparing the data signal and the clock signal and providing a phase comparator output;

a charge pump, coupled to the phase comparator, for producing a charge pump output based on the phase comparator output;

a loop filter, coupled to the charge pump, for producing a control voltage as a function of the charge pump output, the loop filter including a synthetic capacitor comprising:

a passive circuit component of a selected impedance value;

a plurality of amplifiers, each amplifier having respective input means for receiving input signals, respective control means for receiving control signals determinative of a respective multiplicative factor, and respective output means for outputting signals representative of the input signals scaled by the respective multiplicative factor, each amplifier having either its input or output means coupled to either the input or output means of another amplifier of the plurality, one amplifier of the plurality having either its input or output means coupled to either the first or second terminal means, and one amplifier of the plurality coupled to the passive circuit component; and selection means coupled to each control means, for selecting each multiplicative factor independent of signals communicated to either of the first and second terminal means, the impedance of the synthetic component based on each multiplicative factor and the selected impedance value of the passive circuit component; and a voltage controlled oscillator, coupled to the loop filter and the phase comparator, for providing the clock signal with a clock frequency as a function of the control voltage.

11. The phase locked loop of claim 10 wherein the plurality of amplifiers comprises a plurality of transconductance amplifiers.

12. The phase locked loop of claim 11 wherein the selection means includes:

bias means, coupled to the plurality of transconductance amplifiers, for controlling bias currents to the plurality of transconductance amplifiers.

13. The phase locked loop of claim 12 wherein the bias means includes:

a plurality of controllable current sources, coupled to the plurality of transconductance amplifiers, for providing a bias current; and current source controlling means, coupled to the plurality of controllable current sources, for controlling the current of the plurality of controllable current sources.

14. The phase locked loop of claim 13 wherein the current source controlling means includes:

a plurality of control registers, coupled to the plurality of controllable current sources, to provide independent control of each controllable current source.

15. A phase locked loop in a disc drive for controlling a phase relationship between a data signal and a clock signal, the phase locked loop comprising:

a phase comparator for comparing the data signal and the clock signal and providing a phase comparator output;

a charge pump, coupled to the phase comparator, for producing a charge pump output based on the phase comparator output;

a loop filter, coupled to the charge pump, for producing a control voltage as a function of the charge pump output, the loop filter including a synthetic inductor comprising:

a passive circuit component of a selected impedance value;

a plurality of amplifiers, each amplifier having respective input means for receiving input signals, respective control means for receiving control signals determinative of a respective multiplicative factor, and respective output means for outputting signals representative of the input signals scaled by the respective multiplicative factor, each amplifier having either its input or output means coupled to either the input or output means of another amplifier of the plurality, one amplifier of the plurality having either its input or output means coupled to either the first or second terminal means, and one amplifier of the plurality coupled to the passive circuit component; and selection means coupled to each control means, for selecting each multiplicative factor independent of signals communicated to either of the first and second terminal means, the impedance of the synthetic component based on each multiplicative factor and the selected impedance value of the passive circuit component; and a voltage controlled oscillator, coupled to the loop filter and the phase comparator, for providing the clock signal with a clock frequency as a function of the control voltage.

16. The phase locked loop of claim 15 wherein the the plurality of amplifiers comprises:

a plurality of transconductance amplifiers coupled to the physical integrated circuit capacitor and to one another.

17. A data retrieval system comprising:

a data storage medium for storing information;

a transducer, proximate the data storage medium, for producing a read signal indicative of information by the data storage medium;

a plurality of subsystems coupled to the transducer for receiving the read signal and deriving therefrom data signals indicative of information of the storage medium, the plurality of subsystems including a phase-locked loop subsystem and an automatic gain control subsystem, the phase-locked loop subsystem having input means for receiving both a phase reference signal and a version of the read signal subject to a varying phase with respect to the phase reference signal, a phase error detector for producing a phase error signal based on the version of the read signal and the phase reference signal, output means for outputting a data signal based on the phase error signal, and a first synthetic component coupled between the input and output means, the automatic gain control subsystem having input means for receiving another version of the read signal subject to an amplitude correction, output means for outputting a data signal based on the amplitude correction, and a second synthetic component coupled between the input and output means of the automatic gain control subsystem, the first and second synthetic components each having first and second terminal means between which the synthetic component behaves as a selectable passive circuit component, each synthetic component having an impedance selectable independently of signals communicated to either the first or second terminal means of the synthetic component, one of the first and second synthetic components comprising:

a passive circuit component of a selected impedance value;

amplification means including a plurality of amplifiers, each amplifier having input means for receiving input signals, control means for receiving control signals representative of a multiplicative factor, and output means for outputting signals representative of the input signals scaled by the multiplicative factor, the plurality including a first amplifier having input means coupled to either the first or second terminal means, a last amplifier having output means coupled to either the first or second terminal means, and an amplifier coupled to the passive circuit component, each amplifier having either of its input and output means coupled to either the input or output means of another amplifier;

first selection means coupled to each control means, for selecting each multiplicative factor independent of signals communicated to either the first or second terminal means, the impedance of the synthetic component based on each multiplicative factor and the selected impedance value of the passive circuit component;

second selection means coupled to the first and second synthetic components, for selecting respective impedances of the first and second synthetic components; and a controller coupled to at least one of the plurality of subsystems for receiving data signals.

18. The data retrieval system of claim 17 wherein the first selection means comprises:

a plurality of control registers for receiving signals representative of a multiplicative factor for each amplifier of the plurality of amplifiers; and plurality of controllable bias sources, each bias source coupled between a control register of the plurality of control registers and the control means of an amplifier of the plurality of amplifiers.

19. The data retrieval system of claim 17 wherein the impedance of the synthetic component is selectable independently of a magnitude of any signal communicated between the first and second terminal means.

20. The data retrieval system of claim 17 wherein the second selection means comprises:

first and second control registers coupled to the first and second synthetic components for receiving respective control signals upon which the respective impedances are based.

21. A disc drive system, comprising:

a magnetic disc having a surface for storing information;

a magnetic transducer, proximate the magnetic disc, for producing a read signal indicative of information stored on the magnetic disc;

a plurality of subsystems coupled to the magnetic transducer to receive the read signal, the plurality of subsystems processing the read signal to provide a data signal based on the read signal, at least one of the plurality of subsystems including a filter circuit having a synthetic component having first and second terminals between which the synthetic component behaves as a passive circuit component, the synthetic component having a capacitive impedance selectable independently of signals communicated to either of the first and second terminal means, the synthetic component including:

a passive capacitor of a selected impedance value C;

amplification means comprising at least four amplifiers, each having respective input means for receiving input signals, respective control means for receiving signals determinative of respective multiplicative factors g1, g2, g3 and g4, and respective output means for outputting signals representative of the input signals scaled by the respective multiplicative factor, each amplifier having either its input or output means coupled to either the input or output means of another amplifier, one amplifier coupled to either the first or second terminal means and one amplifier coupled to the passive capacitor; and selection means coupled to the respective control means of each amplifier for selecting the respective multiplicative factors g1, g2, g3, and g4 independent of signals communicated to either of the first and second terminal means, the impedance C, of the synthetic component based on $$C_s = \frac{g4g3}{g2g1} \cdot C;$$

a disc drive controller, coupled to at least one of the plurality of subsystems, to receive the data signal; and a servo system coupled to the disc drive controller and the magnetic transducer, the servo system receiving position information from the disc drive controller and positioning the magnetic transducer relative to the magnetic disc based on the position information.

* * * * *

UNITED STATES PATENT AND TRADEMARK OFFICE
CERTIFICATE OF CORRECTION

PATENT NO. : 5,596,459

DATED : JANUARY 21, 1997

INVENTOR(S) : VLADIMIR KOVNER, VADIM B. MINUHIN, SRINIVASAN SURENDRAN

It is certified that error appears in the above-indentified patent and that said Letters Patent is hereby corrected as shown below:

Col. 15, line 24, delete "receiving-signals", insert --receiving signals--

Signed and Sealed this

Twenty-sixth Day of August, 1997

*Attest:*

BRUCE LEHMAN

*Attesting Officer*  Commissioner of Patents and Trademarks